United States Patent
Ningrat (10) Patent No.: US 8,564,311 B2
(45) Date of Patent: Oct. 22, 2013

(54) SENSING PHASE SEQUENCE TO SUPPRESS SINGLE TONE NOISE

(75) Inventor: Kusuma Adi Ningrat, Singapore (SG)

(73) Assignee: STMicroelectronics Asia Pacific Pte Ltd., Singapore (SG)

( * ) Notice: Subject to any disclaimer, the term of this patent is extended or adjusted under 35 U.S.C. 154(b) by 545 days.

(21) Appl. No.: 12/829,130

(22) Filed: Jul. 1, 2010

(65) Prior Publication Data

US 2012/0001643 A1 Jan. 5, 2012

(51) Int. Cl.
*G01R 27/26* (2006.01)

(52) U.S. Cl.
USPC ............ 324/663; 73/718; 73/724; 73/146.5; 375/371; 375/376; 702/117

(58) Field of Classification Search
USPC .......................................... 324/663
See application file for complete search history.

(56) References Cited

U.S. PATENT DOCUMENTS

| | | | | |
|---|---|---|---|---|
| 5,278,513 A * | 1/1994 | Kramer et al. | ........... | 324/667 |
| 5,854,625 A | 12/1998 | Frisch et al. | | |
| 7,119,552 B2 * | 10/2006 | Morimoto et al. | ........... | 324/661 |
| 7,454,967 B2 * | 11/2008 | Skurnik | ........... | 73/146.5 |
| 7,777,501 B2 * | 8/2010 | Reynolds et al. | ........... | 324/678 |
| 7,957,458 B2 * | 6/2011 | Ichiyama et al. | ........... | 375/224 |
| 8,242,828 B1 * | 8/2012 | Mai | ........... | 327/276 |
| 2003/0042439 A1 * | 3/2003 | Rusu et al. | ........... | 250/559.4 |
| 2003/0133527 A1 * | 7/2003 | Joo et al. | ........... | 375/354 |
| 2004/0022151 A1 * | 2/2004 | Furumiya et al. | ........... | 369/47.53 |
| 2004/0095862 A1 * | 5/2004 | Nakajima et al. | ........... | 369/47.28 |
| 2004/0182153 A1 * | 9/2004 | Hamamoto | ........... | 73/335.04 |
| 2005/0044463 A1 * | 2/2005 | Frisch | ........... | 714/738 |
| 2005/0080580 A1 * | 4/2005 | Kantake | ........... | 702/117 |
| 2005/0237891 A1 * | 10/2005 | Kando et al. | ........... | 369/59.11 |
| 2005/0274181 A1 * | 12/2005 | Kutsuna et al. | ........... | 73/504.12 |
| 2007/0001887 A1 * | 1/2007 | Johnstone et al. | ........... | 341/155 |
| 2007/0098128 A1 * | 5/2007 | Ishida et al. | ........... | 375/376 |
| 2007/0100596 A1 * | 5/2007 | Hollis | ........... | 703/14 |
| 2007/0164884 A1 * | 7/2007 | Ihs | ........... | 341/143 |
| 2008/0007534 A1 | 1/2008 | Peng et al. | | |
| 2008/0022762 A1 * | 1/2008 | Skurnik | ........... | 73/146.5 |
| 2008/0025383 A1 * | 1/2008 | Li | ........... | 375/226 |
| 2008/0165041 A1 * | 7/2008 | Parkes et al. | ........... | 341/143 |
| 2008/0304608 A1 * | 12/2008 | Ishida | ........... | 375/371 |
| 2009/0177457 A1 * | 7/2009 | Dai et al. | ........... | 703/14 |
| 2009/0198467 A1 * | 8/2009 | Leitch | ........... | 702/89 |
| 2009/0244014 A1 * | 10/2009 | Hotelling et al. | ........... | 345/173 |

(Continued)

OTHER PUBLICATIONS

Lei et al., "An Oversampled Capacitance-to-Voltage Converter IC With Application to Time-Domain Characterization of MEMS Resonators", IEEE Sensors Journal, Dec. 2005, pp. 1353-1361, vol. 5, No. 6.

*Primary Examiner* — Melissa Koval
*Assistant Examiner* — Benjamin M Baldridge
(74) *Attorney, Agent, or Firm* — Hogan Lovells US LLP (57) ABSTRACT

A noise suppression method for a capacitance-to-voltage converter varies a sequence of sensing signal edges during a plurality capacitance measurements to produce a number of noise responses. The sensing signal edges are varied in a repetitive rising and falling edge pattern for each sequence. Three or more such sequences can be used, and the sequence with the highest noise is eliminated and the others are averaged. The noise suppression method can be implemented during calibration and then used for a number of normal acquisitions. The noise suppression method can be applied to capacitance-to-voltage converters having monitoring and integration phases.

18 Claims, 13 Drawing Sheets

(56) References Cited

U.S. PATENT DOCUMENTS

| | | |
|---|---|---|
| 2009/0322410 A1 | 12/2009 | David et al. |
| 2010/0080274 A1* | 4/2010 | Ishida ............................ 375/226 |
| 2010/0097077 A1 | 4/2010 | Philipp et al. |
| 2010/0097078 A1* | 4/2010 | Philipp et al. .................. 324/684 |
| 2010/0198575 A1* | 8/2010 | Hollis .............................. 703/14 |
| 2010/0299550 A1* | 11/2010 | Bengtson ....................... 713/375 |

* cited by examiner

SENSING PHASE SEQUENCE TO SUPPRESS SINGLE TONE NOISE

BACKGROUND OF THE INVENTION

1. Field of the Invention

The present invention is related to touchscreens, and, more particularly, to a method of reducing noise associated with the touchscreen sensor.

2. Description of the Related Art

Most of the sensing systems used in touch screen applications have a lower sampling frequency compared to the surrounding noise. Single tone noise is very difficult to filter, especially if it has alias(es) in the low frequency region. Unfortunately single tone noise is everywhere, emanating from DC-DC converters, D-class amplifiers, and other switching components.

In the case of a sensor with a fixed sampling frequency, any single tone signal with frequency higher than ½ of the sampling frequency will have aliases. If the alias lays on the low frequency region, a simple average (low pass filter) will not help to suppress it.

Figure 1:
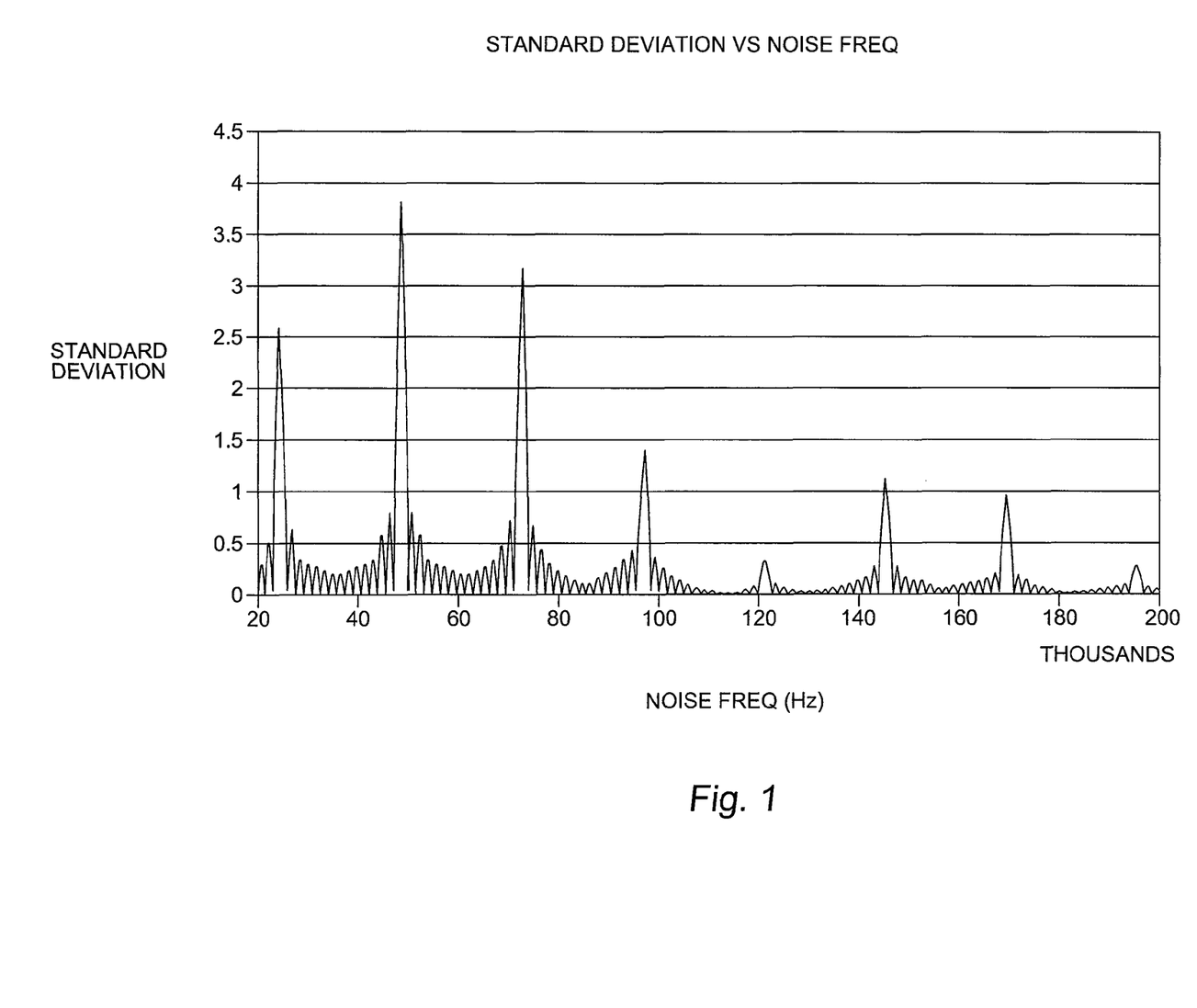
FIG. 1 is a graph of standard deviation versus noise frequency associated with a touchscreen sensor, illustrating aliasing noise components.

Referring now to FIG. 1, a plot is shown of output data standard deviation versus noise frequency where the sampling period is 43 µS in this example. The sensor used to generate the plot shown in FIG. 1 is explained in greater detail below, and number of accumulation is 16×. Evidence of aliases that cannot be filtered by 16× averaging can be seen as peaks of standard deviation in the graph below in FIG. 1. The peaks are generally lower at higher frequency due to analog integration/low-pass filter applied in the sensor for each single conversion (before 16× averaging). It can be seen that although 16× averaging is used, there are frequencies where noise cannot be filtered.

What is desired is a noise reduction method for a touchscreen sensor so that the noise components related to sampling aliases can be minimized.

SUMMARY OF THE INVENTION

A noise suppression method for a capacitance-to-voltage converter varies a sequence of sensing signal edges during a plurality of capacitance measurements to produce a number of noise responses. The sensing signal edges are varied in a repetitive rising and falling edge pattern for each sequence. Three or more such sequences can be used, and the sequence with the highest noise is eliminated, and the other two sequences are averaged. The noise suppression method can be implemented during calibration and then used for a number of normal acquisitions. If desired, the noise suppression method can be applied to capacitance-to-voltage converters having monitoring and integration phases.

BRIEF DESCRIPTION OF THE DRAWINGS

Other advantages and aspects of the present invention will be apparent from the following detailed description taken in conjunction with the following drawings in which.

DETAILED DESCRIPTION

The noise reduction method of the present invention is described, in part, in the context of the commonly assigned co-pending U.S. patent application entitled "Capacitance to Voltage Converter with Improved Signal to Noise Ratio" (Ser. No. 12/972,159), which is hereby incorporated by reference in its entirety. However, the noise reduction method of the present invention is also applicable to any other sensing methods in which there is capacitance to voltage ("C2V") converter, and a sensing signal in which a capacitance value is sampled at a rising or falling edge of a sensing signal, or any C2V converter having a monitoring and an integration phase.

Figure 2:
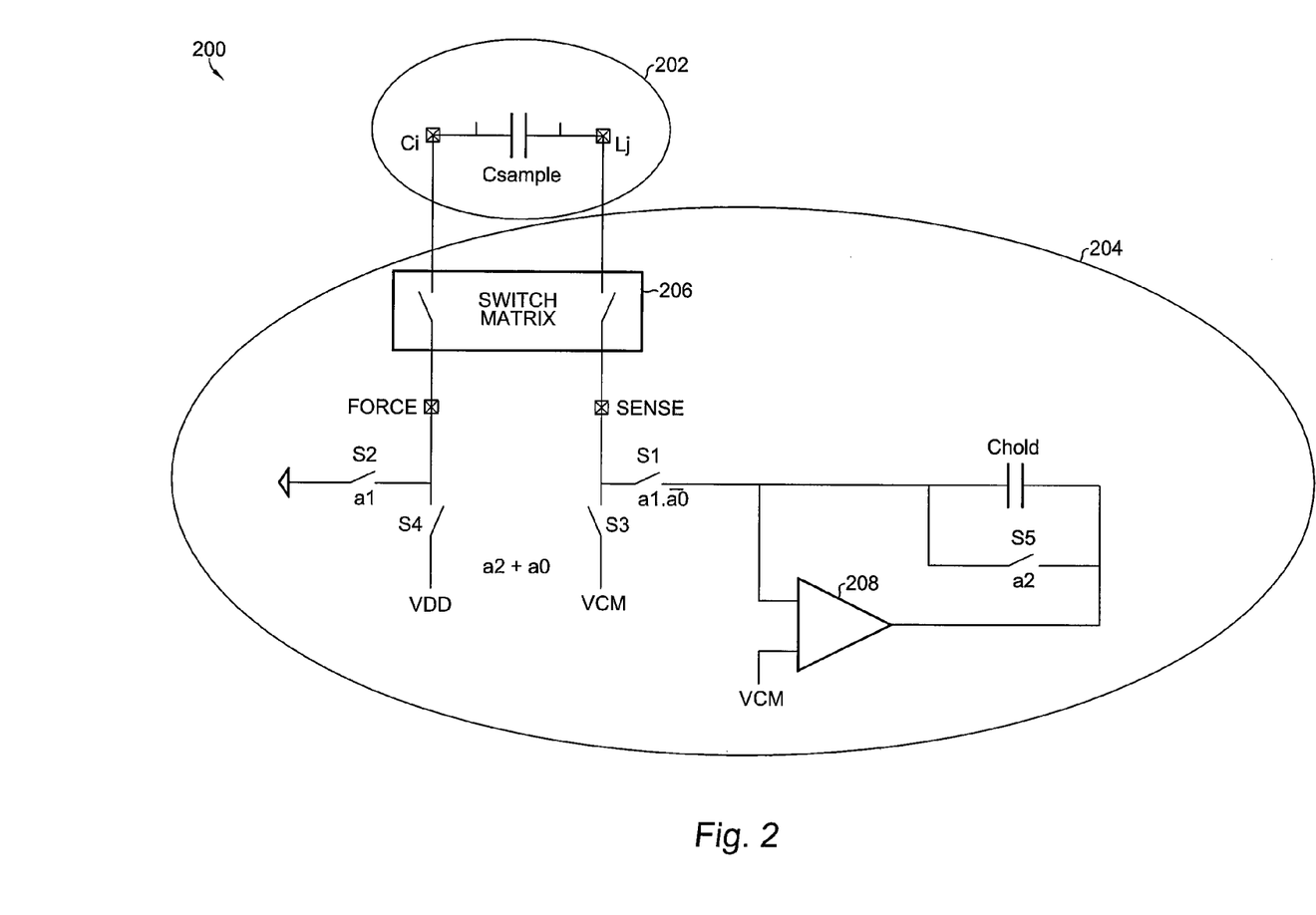
FIG. 2 is a schematic diagram of a state of the art capacitance to voltage converter used in a touchscreen sensor.

A schematic diagram of a state of the art C2V converter 200 is shown in FIG. 2. A switch matrix 206 includes switches to couple the Csample external capacitance 202 desired to be monitored, to the monitoring electronics. In operation, the C2V converter 200 uses a force and sense cycle across the capacitance 202, as is known in the art. In addition, C2V converter includes switch S1 for coupling the Sense line to the ADC including amplifier 208 and hold capacitor Chold. The voltage across capacitor Chold is selectively switched with switch S5. Switch S2 selectively couples the Force line to ground. Switch S3 selectively couples the Sense line to the Vcm voltage. Switch S4 selectively couples the Force line to Vdd.

C2V operation and ADC conversion of the C2V converter 200 shown in FIG. 2 proceeds using three distinct phases, f2 (Sample), f1 (Integrate), and f0 (Hold). During phase f2 (Sample) Csample and Chold are reset, and the Force and Sense lines are "forced" to Vdd and Vcm. During phase f1 (Integrate) the charge is transferred from Csample into Chold, and the Force line is "forced" to ground while the Sense line is "sensed". During phase f0 (Hold), Csample is reset similarly to f2 phase but Chold is not reset and the ADC starts its operation. The operation can last all along f0.

For a given Csample, the output voltage is given by:

$$V\text{out} = v\text{cm} + C\text{sample}/C\text{hold} * V\text{dd}$$

and for a variation $\Delta Cs$ of Csample, the variation of output voltage is given by:

$$\text{signal} = \Delta V\text{out} = \Delta Cs/C\text{hold} * V\text{dd}$$

Figure 3A:
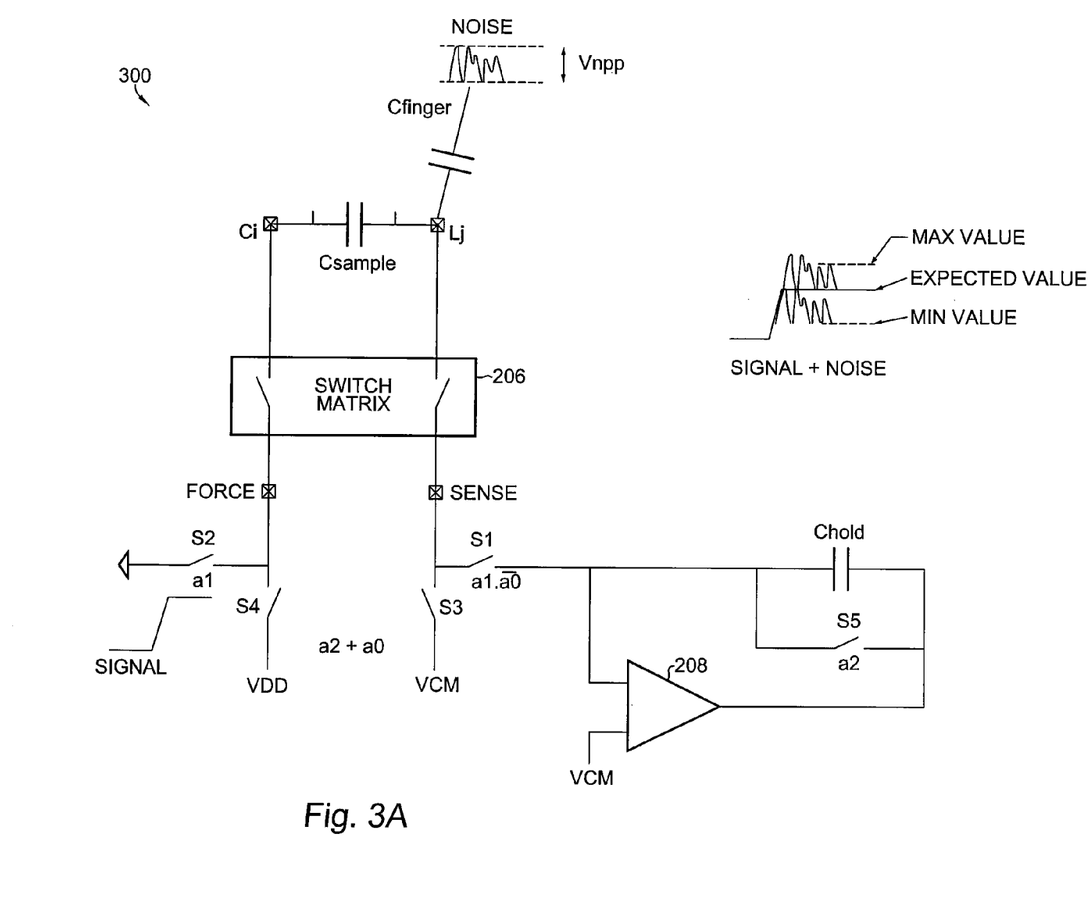
FIG. 3A is the same schematic diagram of FIG. 2, but further illustrating noise sources associated therewith.

In a similar manner, the variation of the output voltage resulting from the introduction of a noise inside the system can be derived. The noise can, for example, be introduced by a human finger touching the "right terminal" (Lj) of the Csample capacitor as is shown in FIG. 3A. This terminal is the sensing terminal of the monitoring circuitry in the touch-screen sensor system. It is assumed that such a contact would be of a "capacitive" type. The output signal having minimum and maximum values due to the introduction of noise is also shown in FIG. 3A.

The output voltage resulting from the noise input is given by:

$$\Delta V\text{out} = C\text{finger}/C\text{hold} * V\text{npp}$$

And, depending on when the switch S1 is closed, the output voltage includes a "DC shift". As a result, the $\Delta V\text{outpp}$ is affected by a factor of two and can reach:

$$\text{noise} = \Delta V\text{outpp} = 2 * C\text{finger}/C\text{hold} * V\text{npp}$$

Figure 3B:
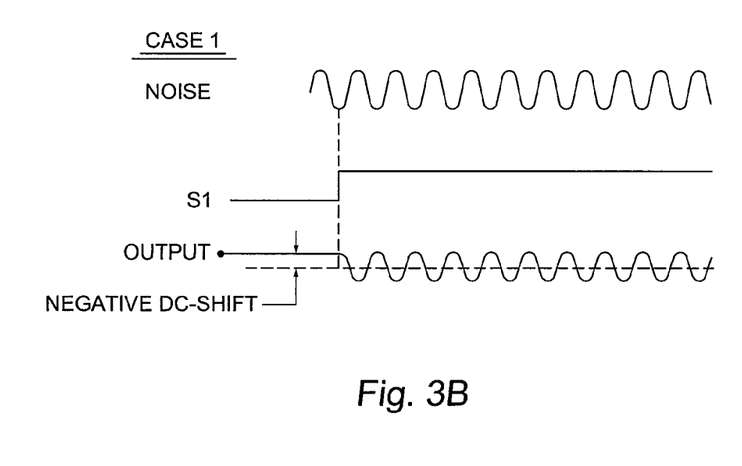
FIGS. 3B and 3C are timing diagrams associated with FIG. 3A.
Figure 3C:
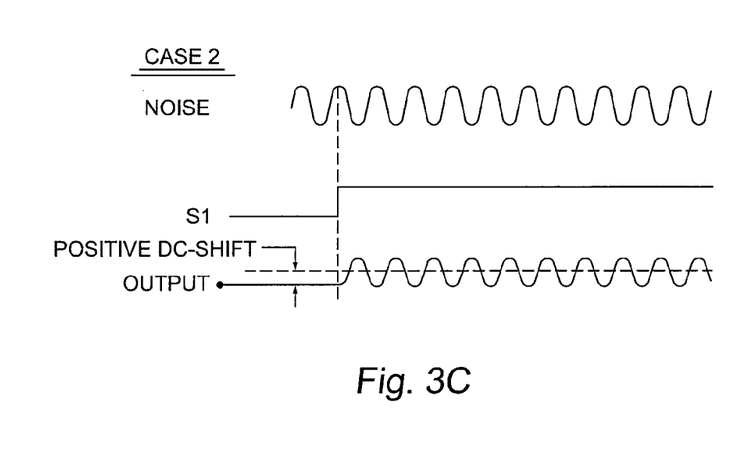

For ease of explanation, the noise is deemed to be a pure tone, and it is important to note that the maximal error (DC shift+ AC) occurs when the period of integration of the signal is $(n+\frac{1}{2})$ times the period of the noise. The reason for this is that if the switch S1 is closed when the noise is at its maximum, then it will be open when the noise is at its minimum and it will produce the greatest error. This is illustrated in further detail with respect to FIGS. 3B and 3C. Because of the DC shift, the noise magnitude is effectively multiplied by a factor of two. Without the DC shift the output noise magnitude is A, and with the DC shift, the output noise magnitude is 2A. Referring back to FIG. 3A, only the closing time of switch S1 determines the DC shift of the noise.

For an integration of 10 µs, a frequency of 450 kHz is used to illustrate.

The Signal to Noise Ratio ("SNR") is given by:

$$\text{SNR} = \Delta Cs/(2 * C\text{finger}) * (V\text{dd}/V\text{npp})$$

Choosing $\Delta Cs = 0.2$ pF, Cfinger=0.5 pF, Vdd=1.8V and Vnpp=2V $$\text{SNR} = 0.18$$

Assuming that the input range is 3 pF (meaning Chold=6 pF), the output swing is 900 mV for 3 pF, the output swing is 600 mV for 2 pF, the quantity of signal corresponding to a 0.2 pF variation is 60 mV, and the output peak-to-peak noise can reach 333 mV. In other words, the "useful" signal/information cannot be extracted from the noisy output voltage.

The SNR is given by:

$$\text{SNR} = \Delta Cs/(2 * C\text{finger}) * (V\text{dd}/V\text{npp})$$

As $\Delta Cs$ and Cfinger are environment dependent, the two only parameters obviously accessible to improve the SNR are the Vdd and the Vnpp. Prior art solutions include boosting the "signal" by using a "high" voltage (in the range of 20V) for the Force voltage applied to the capacitance or lowering the "noise" by using a frequency modulation of the Force signal and by demodulating the signal for the monitoring (the "noise in the useful band" is reduced). While these prior art solutions are technically proven to work, but they might be complicated to implement and are not cost effective.

A first aspect of the noise reduction method according to the present invention is a simple solution, which can be implemented in a low-cost 0.18 µm technology. In the method of the present invention, the DC shift (resulting from the noise) extracted during a monitoring period and subtracted before proceeding to the integration of the signal.

Figure 4:
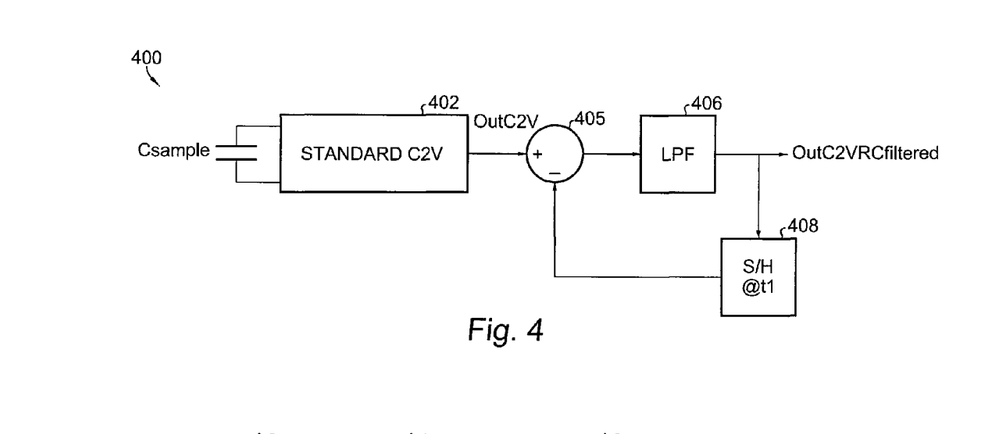
FIG. 4 is a schematic diagram of a noise suppression circuit associated with the capacitance to voltage converter shown in FIGS. 2 and 3A.

With respect to FIG. 4, a block diagram of the overall system 400 employing the noise reduction circuitry of the present invention is shown. System 400 includes a standard C2V converter 402 as previously described coupled to an external Csample capacitor. The output of converter 402, designated C2V, is coupled to the positive input of a summer 405 as shown. The output of the summer 405 is coupled to a low pass filter 406 to provide the OutC2VRC filtered output signal. The output signal is coupled to the input of a sample and hold circuit 408. The output of sample and hold 408 is coupled to the negative input of summer 405.

Figure 5:
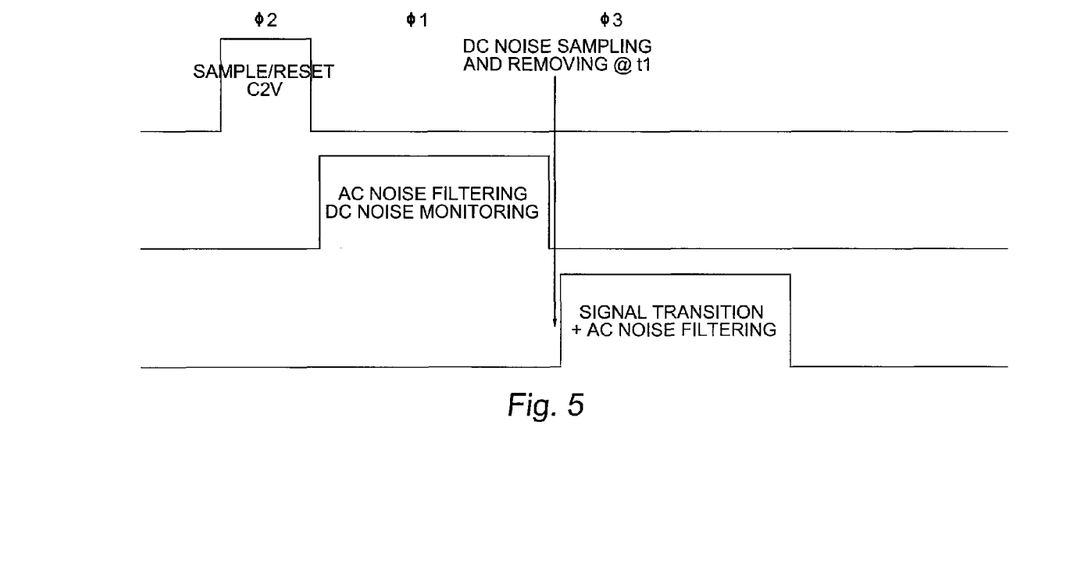
FIG. 5 is a timing diagram associated with the schematic diagram of FIG. 4.

In operation, the timing signals for the three different phases of C2V converter are shown in FIG. 5 including sample/reset during f2, AC noise filtering and DC noise monitoring during f1, and signal transition and AC noise filtering during f3. The DC noise sampling and removing is done at time t1 as shown in FIG. 5.

Figure 6:
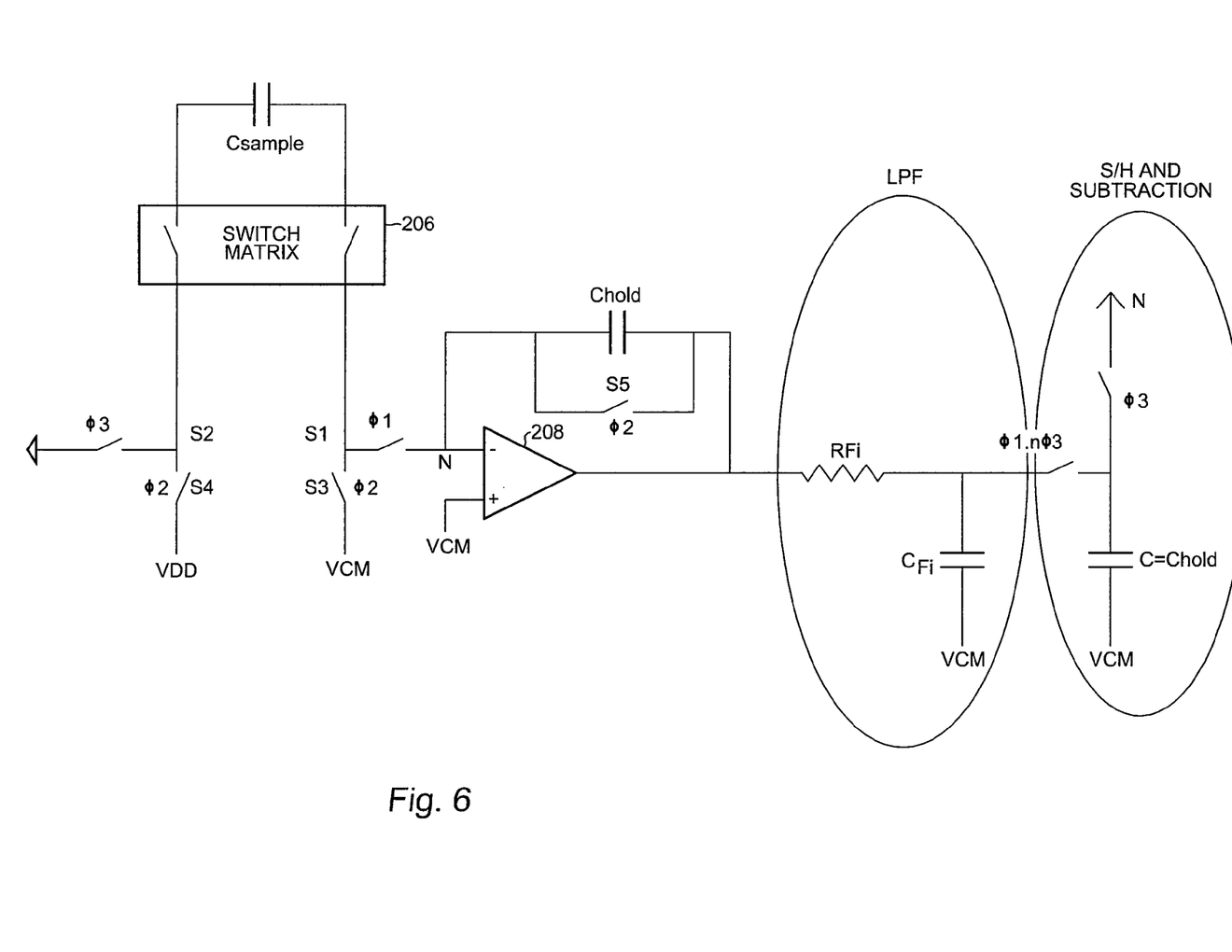
FIG. 6 is a more detailed schematic diagram of the circuit shown in FIG. 4.
Figure 7:
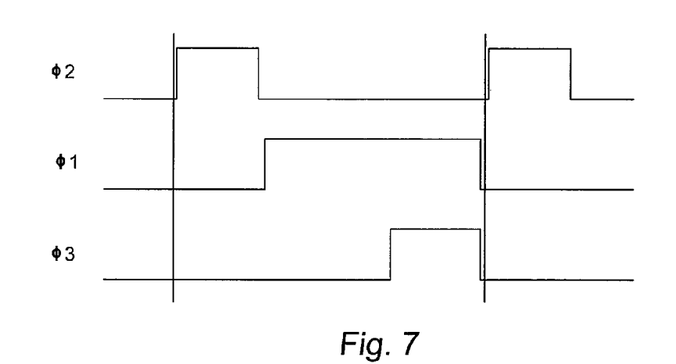
FIG. 7 is a timing diagram associated with the schematic diagram of FIG. 6.

The filtering system for the C2V converter and noise reduction system is shown in further detail in FIG. 6. In particular, the low pass filter includes a resistor RFi, and a capacitor CFi coupled to the common mode voltage VCM. The timing signals for operating the circuit shown in FIG. 6 during all three phases of operation are shown in FIG. 7.

The system shown in FIG. 6 is designed so that its behavior remains linear during the f3 rising transition. This condition ensure the continuity of the noise signal over the f3 rising transition. The condition is easy to fulfill as long as the slewing of the amplifier 208 is faster than the RC time constant of the Touch Panel itself.

The DC shift is memorized inside a capacitance having a value similar to the holding capacitance and the charge is pushed inside Chold just at the beginning of f3. The DC shift cancellation can be performed inside the C2V converter.

By getting rid of the DC shift, the SNR is already improved by a factor of two.

By filtering the AC noise, the SNR at a given frequency f (above RC filter cut-off frequency) is improved by the ratio f/fc:

$$\text{SNR} = \Delta Cs/C\text{finger} * (V\text{dd}/V\text{npp}) * f/fc1$$

To gauge the amount of improvement in the signal to noise ratio, the noise is considered to be a pure tone at 450 kHz for which the SNR without improvement is SNR=0.18. With the improvement:

(with $\Delta Cs = 0.2$ pF, Cfinger=0.5 pF, Vdd=1.8V, Vnpp=2V, f=450 kHz, fc1=191 kHz)

$$\text{SNR} = 0.84$$

A description of a first aspect of the present invention has been made with respect to a state of the art C2V converter and DC subtraction noise cancellation method having a monitoring phase and an integration phase. The SNR has been improved by 4.6 times. A second aspect of the present invention is described in further detail that can be applied either to the C2V generator shown in FIG. 2 having a monitoring and integration phase, or can be generally applied to any touch-screen sensor system having a rising/falling edge sensing signal or monitoring/integration phases for capturing a touch-screen capacitance value.

Figure 8:
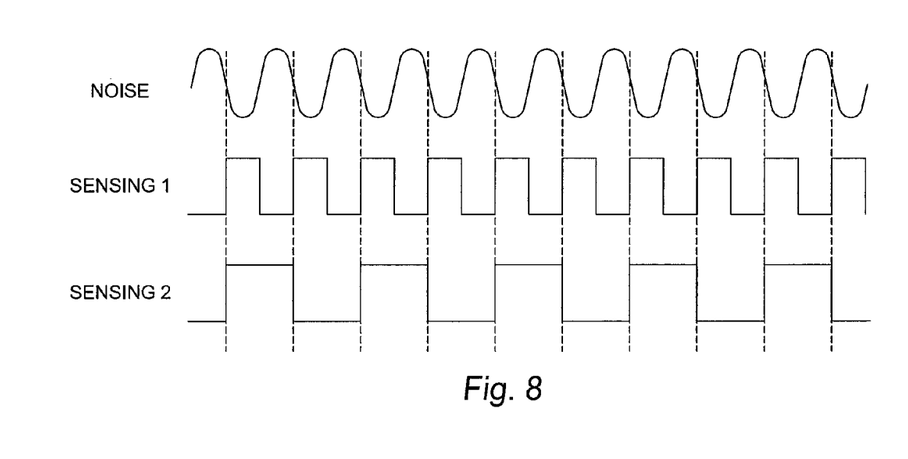
FIG. 8 is a timing diagram of noise and two sensing signals.

The phase of the sensing signal and its effect on a noise signal is described below with respect to FIG. 8. In FIG. 8, it is assumed that the noise signal is sinusoidal. Depending on the sensing signal edge (phase), the rising/falling slope of the noise signal gives different vectors of error. For example, if the sensing signal has a falling edge, rising slope of the noise gives a (−) error in the capacitance measurement, while a falling slope of the noise signal gives a (+) error. If the sensing signal has a rising edge, the effect will be reversed.

Assuming 16× averaging in the condition where the noise frequency is the same as or a multiple of the sampling frequency, each of the samples will have the same error in magnitude and direction, hence the average process will not be able to help to correct the error.

This "frequency response" can be modified by changing the sensing phase of the average samples. For example, in the same condition stated above, if the sensing phase of each sample is varied (rising, falling, rising, falling, . . . ), the error magnitude of each sample is similar, but half of the samples have a (+) direction of error while the other half have a (−) direction. In this case, an averaging process will eliminate the measurement error caused by the noise.

With respect to FIG. 8, the Sensing 1 sensing signal uses only rising edges to perform the capacitance measurement. Since the sensing edges are always affected by the falling slope of the noise, all the measurement results have a (−) error. The Sensing 2 sensing signal uses both rising and falling edges consecutively with the same sampling frequency as the Sensing 1 sensing signal. The measurement results have a (−) error when using rising edge sensing and a (+) error when using falling edge sensing. After 16× averaging, the Sensing 1 sensing signal will still have a (−) error, while the Sensing 2 sensing signal will have substantially zero error.

Thus, it is possible to modify the response to noise frequency by altering the capacitance measure sequencing, as is shown below with respect to FIGS. 9-12. As described above with respect to FIGS. 4-7, white noise from a human finger touch is filtered by integrating Baseline/Monitoring (M) of the system and then integrating the Signal/Integration (I). The output is the difference between I and M. If the Monitoring cycle is performed before the Integration cycle, the system has falling sensing signal edge and vice versa. The response of the system which has only falling edge sensing signal is shown in FIG. 1. The standard deviation is calculated after 16× average out of 2000 capacitance measurements. If the sequence of M and I is varied (variation of sensing signal edge) during average process, the "frequency response" of the system can be modified which is shown in FIGS. 9, 10, and 11.

Figure 9:
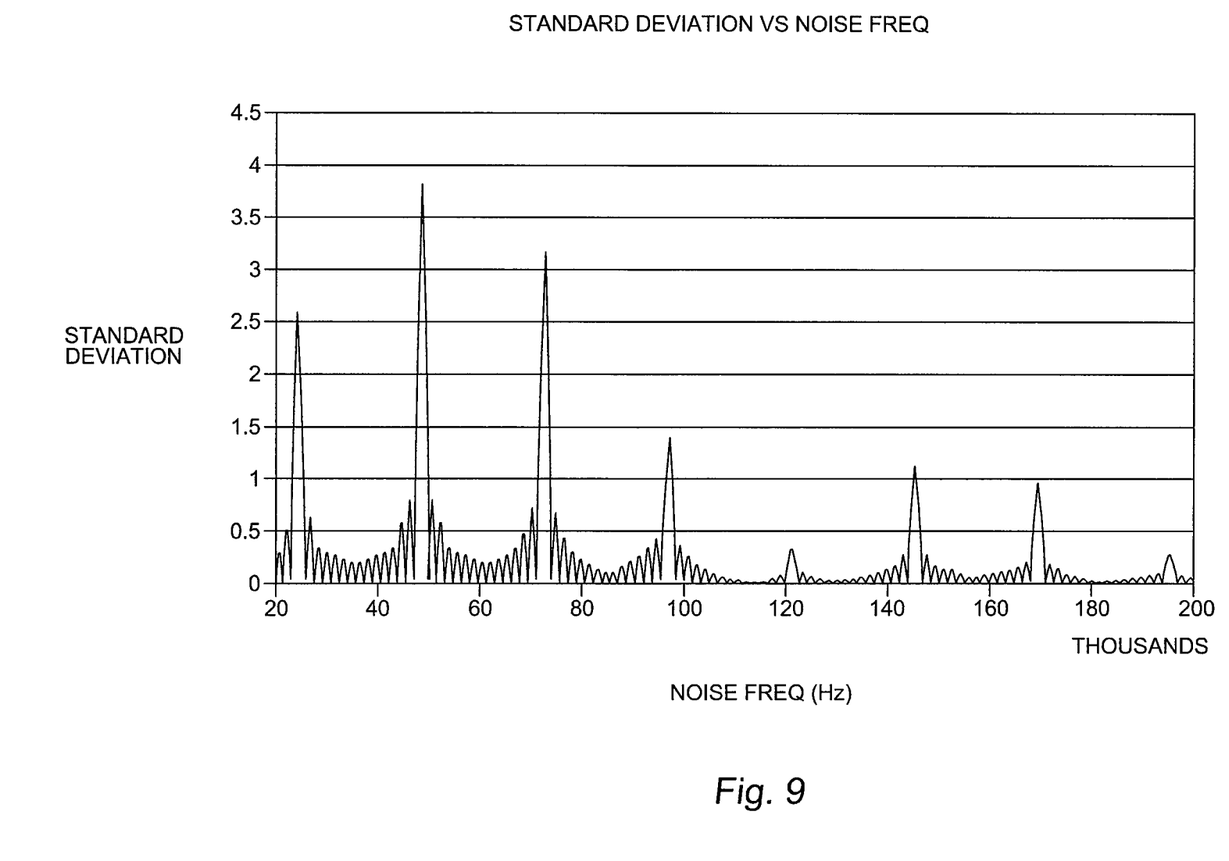
FIG. 9 is a graph of standard deviation versus noise frequency for a first monitoring/integration sequence according to the present invention.

In FIG. 9, the following monitoring/integration phase sequence is used when making the capacitance measurement: M-I, M-I, M-I, M-I, M-I, M-I, M-I, M-I, . . . . The resultant standard deviation versus noise frequency is plotted showing the noise peaks due to aliasing.

Figure 10:
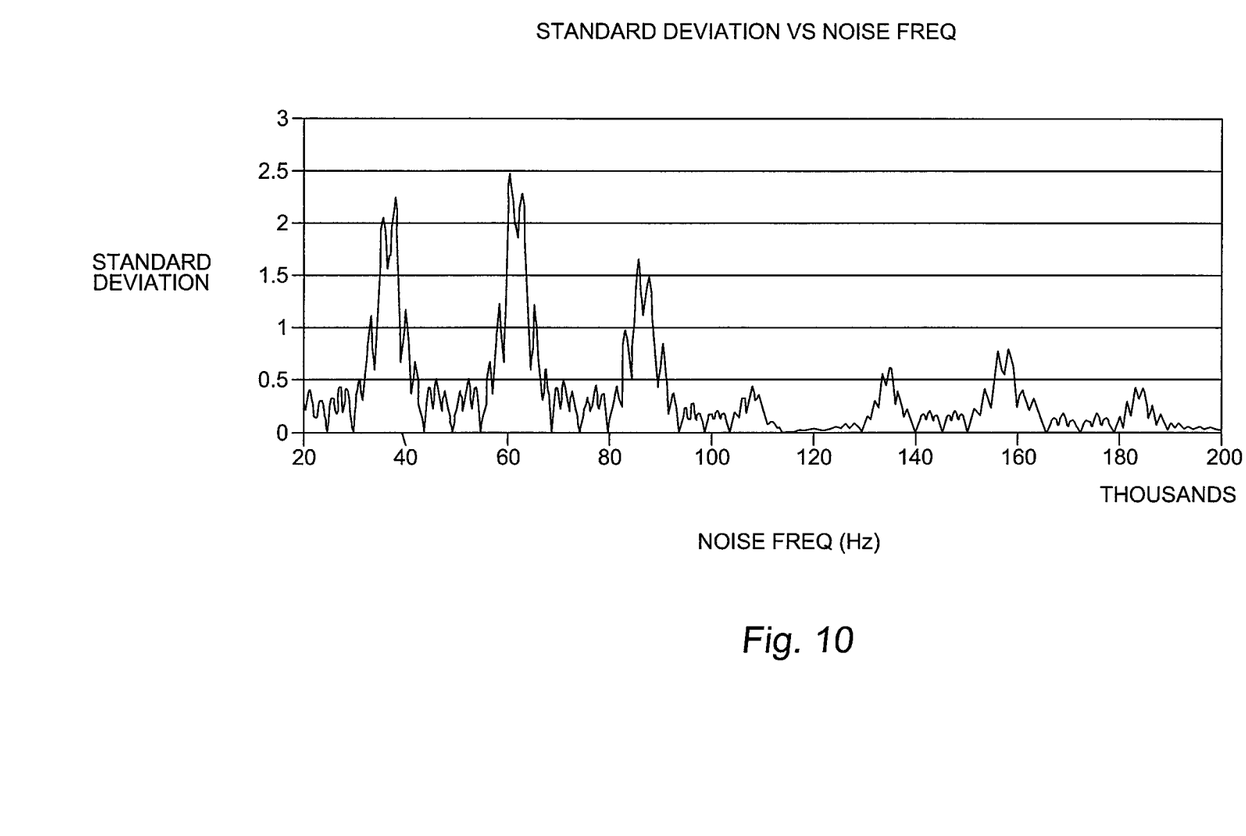
FIG. 10 is a graph of standard deviation versus noise frequency for a second monitoring/integration sequence according to the present invention.

In FIG. 10, the following monitoring/integration phase sequence is used when making the capacitance measurement: M-I, I-M, M-I, I-M, M-I, I-M, M-I, I-M, . . . . The resultant standard deviation versus noise frequency is plotted showing the noise peaks due to aliasing.

Figure 11:
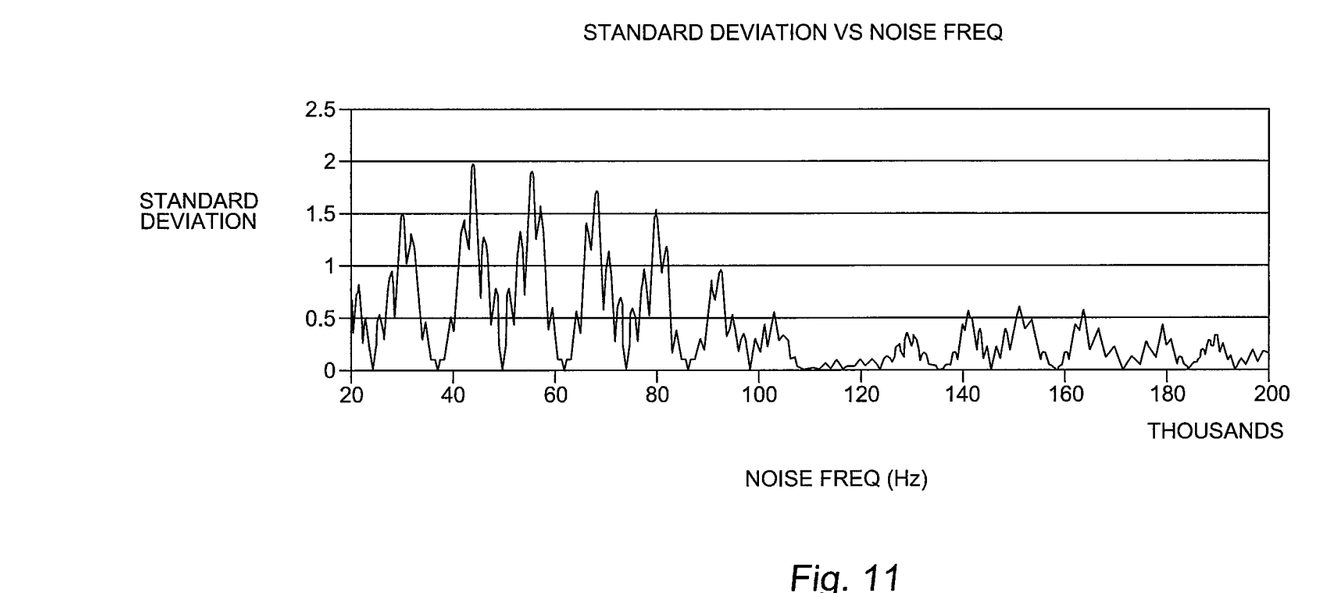
FIG. 11 is a graph of standard deviation versus noise frequency for a third monitoring/integration sequence according to the present invention.

In FIG. 11, the following monitoring/integration phase sequence is used when making the capacitance measurement: M-I, M-I, I-M, I-M, M-I, M-I, I-M, I-M, . . . . The resultant standard deviation versus noise frequency is plotted showing the noise peaks due to aliasing.

Figure 12:
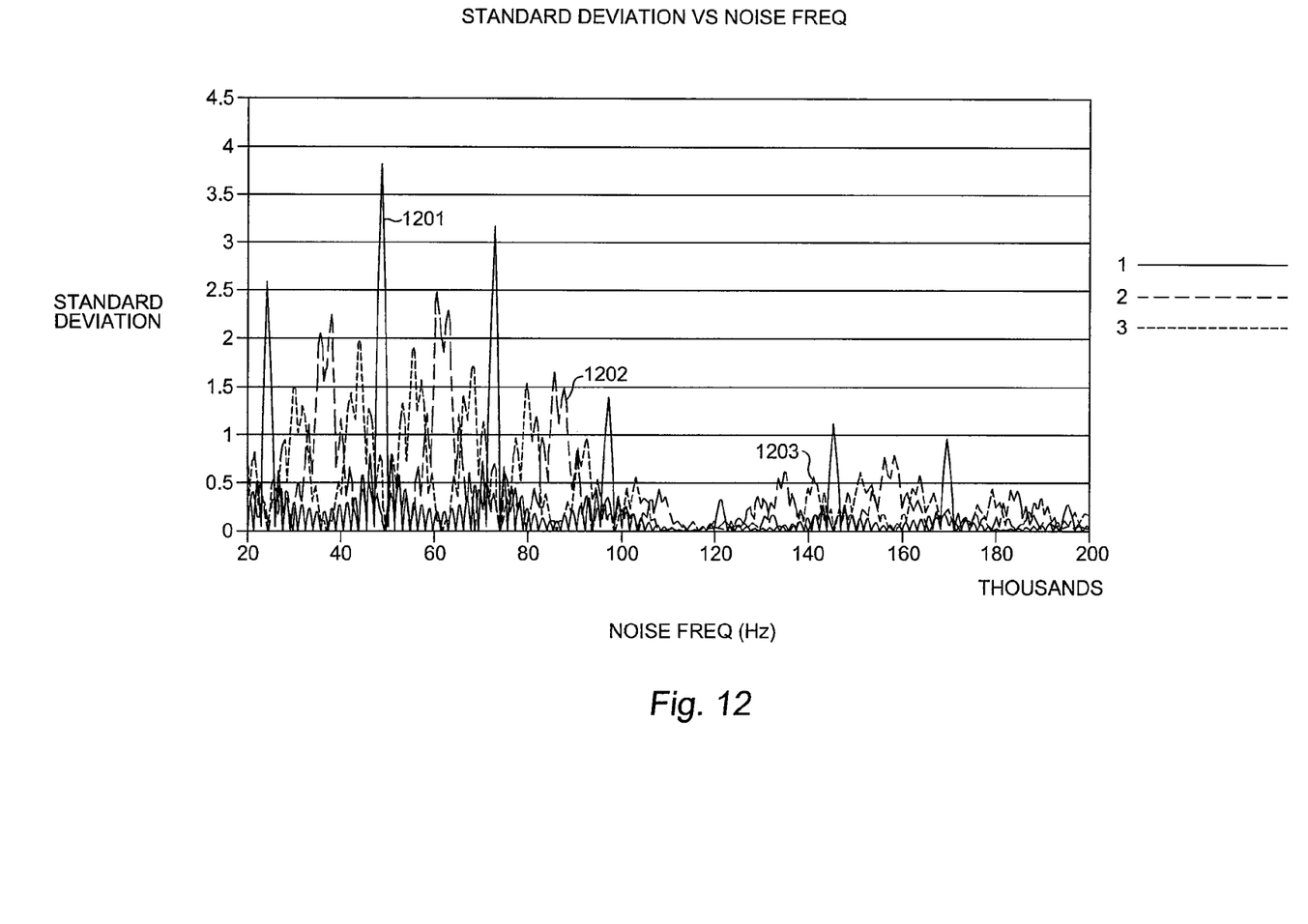
FIG. 12 is a composite graph of standard deviation versus noise frequency using all three monitoring/integration sequences of FIGS. 9-11.

In FIG. 12, all three standard deviations with respect to noise frequency are shown. Trace 1201 corresponds to the output shown in FIG. 9, trace 1202 corresponds to the output shown in FIG. 10, and trace 1203 corresponds to the output shown in FIG. 11. Once the data can be compared as is shown in FIG. 12, the system selects the "quiet" sequence. If the data of the different sequences are drawn in the same graph as shown in FIG. 12, it is clear that the noisy/peak area of each sequence occupies a different frequency region as is shown below.

To minimize noise, the noisy frequency of the system is desired to be avoided. To evaluate and choose the "quiet" sequence, a "brute-force" method explained below can be used. The three sequences are applied to each capacitance measurement as shown in FIGS. 9-11. As an example each sequence can use 8× averaging. For each capacitance measurement, the three results from all the sequences are evaluated. If the noise is a single tone, according to graph of FIG. 12, there is only one sequence that is affected badly by the noise. From the three results, the outlier of the population is discarded and the other two samples are then averaged to get the final result.

Figure 13:
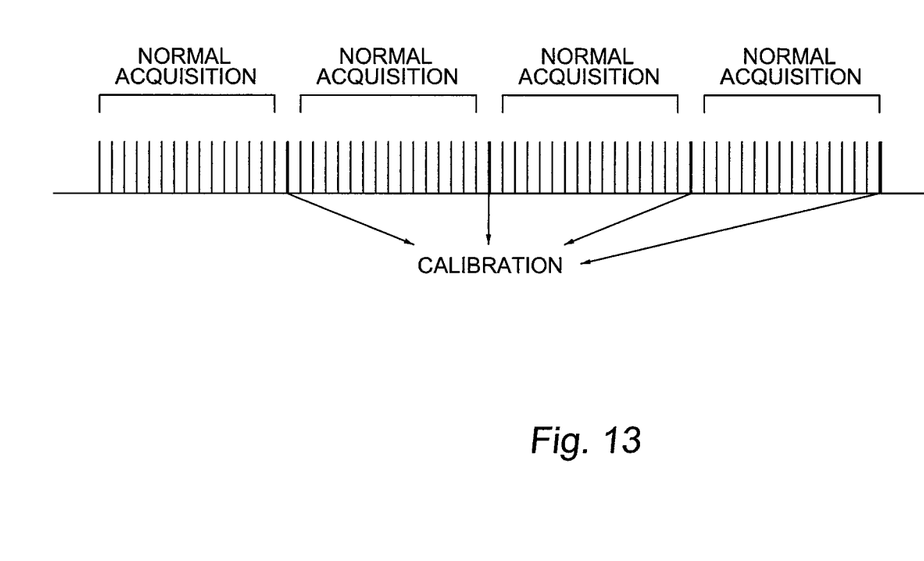
FIG. 13 shows a normal acquisition/calibration sequence according to the method of the present invention.

As is shown in FIG. 13, another method with respect to the present is accomplished by doing the above evaluation in a few locations on the touch screen panel during calibration to define which sequence is most noisy in a given noise frequency. Then, the system chooses one sequence from the other two options for normal data acquisition. This process can then be repeated as shown in FIG. 13 for additional calibration/normal acquisition cycles.

Figure 14:
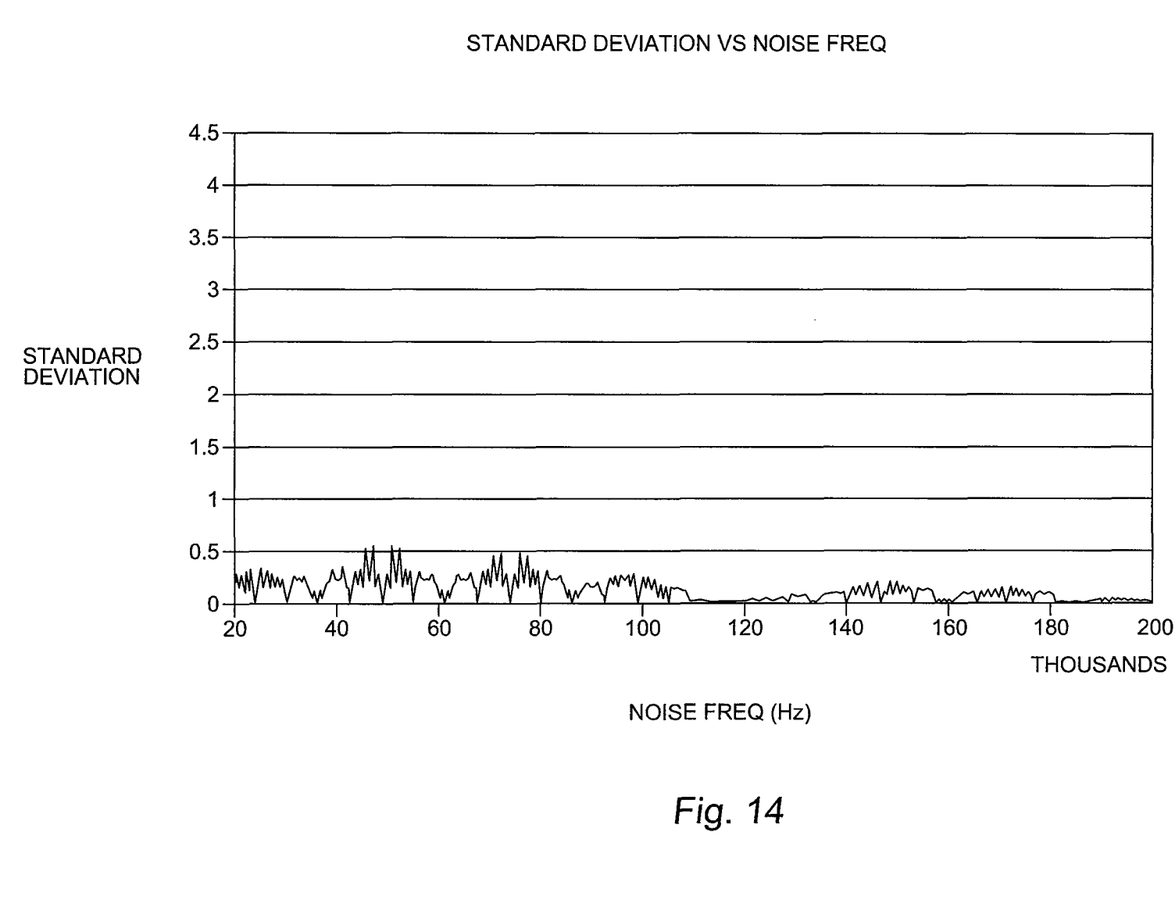
FIG. 14 is a plot of standard deviation versus noise frequency for a selected sequence having the least noise according to the method of the present invention.

Referring now to FIG. 14, the output standard deviation of a touch screen system using the noisy frequency avoidance method of the present invention is plotted versus noise frequency. It is clear from these results that noise performed is much improved.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

I claim:

1. A single tone noise suppression method for a capacitance-to-voltage converter in a capacitance measurement system, comprising:
    performing three or more successive capacitive measurements on a capacitance under test to produce respective single tone noise responses, each successive measurement using a different sequence of sensing signals;
    disregarding the capacitance measurement with the highest single tone noise response; and
    averaging the remaining measurements to obtain a capacitance measurement with reduced single tone noise levels.

2. The noise suppression method of claim 1 in which a first capacitance measurement comprises using a sequence of sensing signals having a first repetitive rising and falling edge pattern.

3. The noise suppression method of claim 2 in which a second capacitance measurement comprises using a sequence of sensing signals having a second repetitive rising and falling edge pattern.

4. The noise suppression method of claim 3 in which a third capacitance measurement comprises using a sequence of sensing signals having a third repetitive rising and falling edge pattern.

5. The noise suppression method of claim 1 in which the sensing signal comprises a repetitive sequence of a falling edge followed by a rising edge for performing the capacitance measurement.

6. The noise suppression method of claim 1 in which the sensing signal comprises a repetitive sequence of two falling edges followed by two rising edges for performing the capacitance measurement.

7. The noise suppression method of claim 1 further comprising eliminating the sensing signal sequence associated with the capacitance measurement having the highest noise.

8. The noise suppression method of claim 1, in which the method is performed during a calibration phase.

9. The noise suppression method of claim 8, in which a selected sensing signal sequence is used to perform a plurality of normal acquisitions.

10. A single tone noise suppression method for a capacitance-to-voltage converter in a capacitance measurement system, comprising:

performing three or more successive capacitive measurements on a capacitance under test;

varying a sequence of monitoring and integrating phases during each of the capacitance measurements, wherein the monitoring and integrating phases are varied for each sequence, to produce a plurality of noise responses;

eliminating the capacitance measurement with the highest single tone noise response; and averaging the remaining measurements to obtain a capacitance measurement with reduced single tone noise levels.

11. The noise suppression method of claim 10 in which a first capacitance measurement comprises using a first repetitive sequence of monitoring and integrating phases.

12. The noise suppression method of claim 11 in which a second capacitance measurement comprises using a second repetitive sequence of monitoring and integrating phases.

13. The noise suppression method of claim 12 in which a third capacitance measurement comprises using a third repetitive sequence of monitoring and integrating phases.

14. The noise suppression method of claim 10 comprising a repetitive sequence of a first monitoring phase, a first integrating phase, a second integrating phase, and a second monitoring phase for performing a capacitance measurement.

15. The noise suppression method of claim 10 comprising a repetitive sequence of two monitoring/integrating phases followed by two integrating/monitoring phases for performing a capacitance measurement.

16. The noise suppression method of claim 10 further comprising eliminating the sequence associated with the capacitance measurement having the highest noise.

17. The noise suppression method of claim 10, in which the method is performed during a calibration phase.

18. The noise suppression method of claim 17, in which a selected sequence is used to perform capacitance measurements during normal operation of the capacitance measurement system.

* * * * *